(12) United States Patent
Yu et al.

(10) Patent No.: US 11,437,971 B2
(45) Date of Patent: Sep. 6, 2022

(54) WIDEBAND RECONFIGURABLE IMPEDANCE MATCHING NETWORK

(71) Applicant: Intel IP Corporation, Santa Clara, CA (US)

(72) Inventors: Chuanzhao Yu, Phoenix, AZ (US); Maximilian Eschbaumer, Munich (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/976,084

(22) PCT Filed: Jun. 27, 2018

(86) PCT No.: PCT/US2018/039761
§ 371 (c)(1),
(2) Date: Aug. 27, 2020

(87) PCT Pub. No.: WO2020/005231
PCT Pub. Date: Jan. 2, 2020

(65) Prior Publication Data
US 2021/0119596 A1 Apr. 22, 2021

(51) Int. Cl.
| | | |
|---|---|---|
| H03H 7/38 | (2006.01) | |
| H03F 1/56 | (2006.01) | |
| H03F 3/195 | (2006.01) | |
| H03F 3/24 | (2006.01) | |
| H03H 7/09 | (2006.01) | |
| H03H 7/01 | (2006.01) | |

(52) U.S. Cl.
CPC .............. *H03H 7/38* (2013.01); *H03F 1/565* (2013.01); *H03F 3/195* (2013.01); *H03F 3/245* (2013.01); *H03H 7/09* (2013.01); *H03H 7/1741* (2013.01); *H03F 2200/451* (2013.01); *H03F 2200/537* (2013.01); *H03H 2007/013* (2013.01)

(58) Field of Classification Search
CPC .......... H03H 7/38; H03H 7/09; H03H 7/1741; H03H 2007/013; H03F 1/565; H03F 3/195; H03F 3/245; H03F 2200/451; H03F 2200/537
USPC ....................................................... 330/302
See application file for complete search history.

(56) References Cited

U.S. PATENT DOCUMENTS

| | | |
|---|---|---|
| 5,986,617 A | 11/1999 | McLellan |
| 2013/0057343 A1 | 3/2013 | Kondo |

(Continued)

*Primary Examiner* — Hafizur Rahman
(74) *Attorney, Agent, or Firm* — 2SPL Patent Attorneys PartG mbB; Kieran O'Leary (57) ABSTRACT

Embodiments relate to a transformer-based impedance matching network that may dynamically change its characteristic impedance by engaging different inductor branches on a primary side and optionally, on the secondary side. A primary side transformer circuit includes a primary inductor (311) and secondary inductor (321) configured to provide impedance matching over a first frequency band. One or more additional inductor branches (314A, 314B, are switchably coupled to either or both of the primary and secondary inductors to modify the impedance matching characteristics over additional operating frequencies. One or more LC filter branches (321, 322, 326, 327, 336, 330) can be included at the output of the secondary side to filter harmonic frequencies in each of the operating frequency bands.

23 Claims, 7 Drawing Sheets (56) References Cited

U.S. PATENT DOCUMENTS

2013/0241666 A1\* 9/2013 Granger-Jones .......... H01P 1/15
                                                    333/101
2015/0194944 A1   7/2015 Joshi et al.

\* cited by examiner

WIDEBAND RECONFIGURABLE IMPEDANCE MATCHING NETWORK

BACKGROUND

Embodiments of the present invention relate generally to wireless communications, and more particularly, but not limited to, communication circuits and a transformer based impedance matching network and power amplifier for a transmitter.

Mismatches can occur at interfaces between various equipment e.g. transmitter, cable and antenna and when signal reflection occurs due to impedance mismatch between the signal source and the antenna, reflected standing waves are produced in the transmission line wasting transmission power. Therefore, impedance matching networks are implemented to reduce reflected waves and increase power consumption efficiency as much as possible.

Low power consuming transceivers are important for mobile devices and wireless nodes such as those used for the internet-of-things (IoT). Mobile wireless devices are inherently limited by size in form and by their respective power consumption from available sources. Two of the largest power consumers in mobile transceivers are oscillators and amplifiers in transmit chains. As modern wireless devices incorporate an ever increasing number of frequency bands, preferably by a single chip radio, conventional designs require multiple amplifier chains to cover the wide target frequency range. Multiple chains amplifier chains plus their respective impedance matching networks have conventionally been used, which leads to significant consumption in chip area and power consumption.

Accordingly, there is a constant effort to increase efficiencies in mobile devices, particularly in transmit chain(s), to extend battery life and mobile operation of these devices. Certain embodiments of the present invention enable such efforts via transmitter (TX) architectures and methods for low power radios including transmit chains with a configurable transformer-based impedance matching network.

BRIEF DESCRIPTION OF THE DRAWINGS

Certain circuits, logic operation, apparatuses and/or methods will be described by way of non-limiting example only, in reference to the appended Drawing Figures in which:

FIG. 7 shows an exemplary basic circuit diagram for a reconfigurable wideband impedance matching network according to other embodiments of the present disclosure.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the aspects of the various embodiments may be practiced in other examples that depart from the specific details discussed herein. In certain instances, descriptions of well-known devices, circuits, and methods are omitted so as not to obscure the description of the various embodiments with unnecessary detail.

Figure 1:
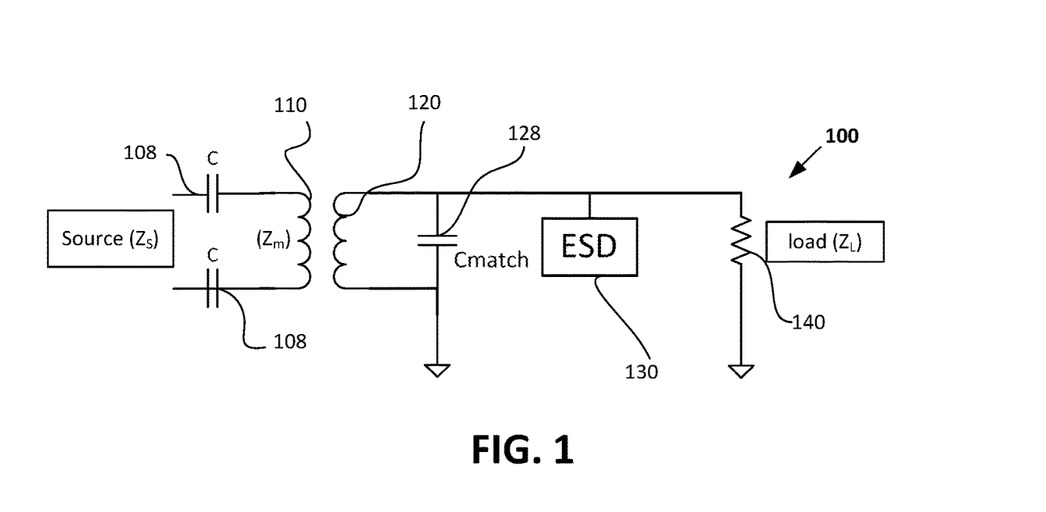
FIG. 1 shows a circuit diagram of an example of an inductor-based impedance matching network of the type that might be found in conventional devices.

In communications, and other electronic devices, it is generally desirable to match a power/signal source, e.g., a power amplifier (PA), impedance ($Z_S$) with a load, e.g., an antenna, impedance ($Z_L$), to avoid reflection and loss between the source and load. Referring to FIG. 1, an example impedance matching network 100, in a potentially conventional radio frequency (RF) application, may use a transformer-based approach for impedance matching between the source and load. Transformers offer a nearly ideal solution for making one impedance look like another. Transformers match only the "real" part of the impedance. If there is a large amount of reactance in the load, a transformer will not eliminate these reactive components. In fact, a transformer may exaggerate the reactive portion of the load impedance. The reactive components then result in power that is reflected. Transformers have difficulties at microwave frequencies, but provide wider bandwidths than L-C matching circuits. Advantages of using transformers for impedance matching including: a relatively wide bandwidth, e.g., exceeding 1000 MHz; excellent amplitude and phase balance; and higher return loss (lower VSWR) at the primary side.

Impedance (Z) is defined as the total opposition of a circuit to the flow of an alternating current (AC) at a given frequency, and is represented as a complex quantity in an impedance vector having a real part, resistance (R), and an imaginary part, reactance (X), expressed using the rectangular coordinate form: $Z=R+jX$ or $Z=\sqrt{R^2+X^2}$. Here, reactance X may be one or both of inductive reactance ($X_L$), and/or capacitive reactance ($X_C$), and $X=X_L-X_C$, which, respectively, are (ideally) calculated as: $X_L=\omega^*L=2\pi^*f^*L$ and/or $X_C=1/(\omega^*C)=1/(2\pi^*f^*C)$.

In an LC circuit, when the reactance magnitudes are equal, i.e., $X_L=X_C$, at a particular frequency, the circuit "resonates." A series-connected LC circuit operating at resonant frequency has a net reactance of zero, behaving as a short circuit, whereas a parallel-connected LC circuit at resonant frequency has an infinite net reactance and behaves as open circuit.

In transformer-based matching network 100, a simple relationship of transformer turns/windings ratio (N) is proportionate to the turns ($N_P$) of the transformer primary inductor 110 and the number of turns ($N_S$) of the transformer secondary inductor 120, or $N=N_P:N_S$. In one example, a simple impedance relationship may then be expressed as $Z_S/Z_P=(N_S/N_P)*2$, or $N_S/N_P=\sqrt{(Z_S/Z_P)}$, which at resonant frequency, becomes simply a resistance value and easily designed to match the source and load resistances at the desired operating frequency.

RF and/or other high frequency applications utilizing signals with a wavelength ($\lambda$, where $\lambda=c/f$) shorter than the length of a conduit the signal passes through, e.g., coaxial cable, strip line, microstrip circuits, waveguides, etc., transmission line impedance matching theory is used because the phase/complex portion of the signal becomes critical in matching impedance and reducing SWR. For example, and refraining from a full tutorial, in transmission line impedance matching, a matching network transmission line may be characterized as a network of resistors, inductors and capacitors having a generalized characteristic impedance $Z_0=\sqrt{(R+j\omega L/G+j\omega C)}$, where $\omega$ is the angular frequency (or $2\pi*$frequency in Hz), and per unit length, R=resistance, G=conductance, L=inductance and C=capacitance. Accordingly, as one can see from FIG. 1, matching network 100 requires secondary main inductor (Lsm) 120 and capacitance 128 selected to match the real and complex portions of impedance between source load 140 to effectively impedance match. It is noted that this generalized discussion omits reflectance ($\Gamma$) calculations of the transmission line itself.

Additionally, matching network 100 may include an electrostatic discharge (ESD) component 130, such as a spiral inductor, to prevent damage to the matching network from static charge. Transformers may often be used as an ESD protection element 130 in addition to impedance matching components of the network 100, as during an ESD event, the inductor becomes the path through which the ESD current shunts to ground due to the frequency of the ESD being much lower than the operating frequency of the general RF circuit.

Thus in transmission line impedance matching, resonant circuits with primary inductor 110 and capacitors 108 of the signal source, are impedance matched/tuned to the frequency band of desired operation ($F_O$), e.g., tuned to the center frequency, in a particular TX chain.

According to various embodiments, in order to increase the bandwidth of a common transformer based matching network like shown in FIG. 1, switches and additional inductors may be included to enable a multiband and more wideband operation through re-configuration. The center frequency of the matching network is primarily determined by the input side in-series capacitance C and the transformers primary side inductance L1. Thus at minimum, only the primary side could include switchable inductor branches to dynamically alter the impedance characteristics.

Figure 2:
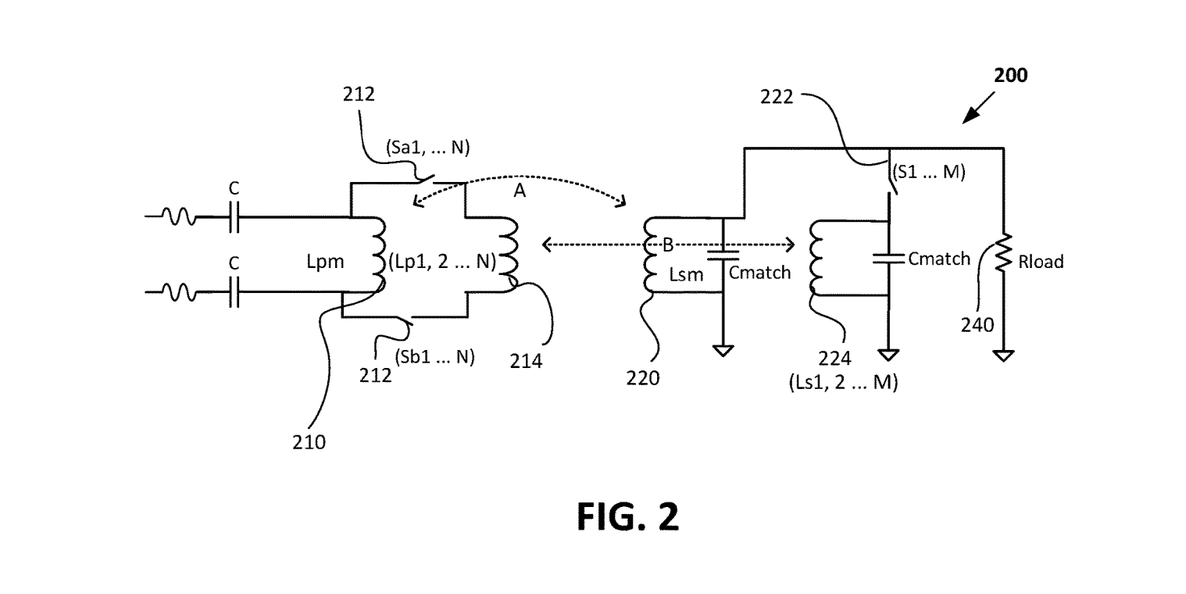
FIG. 2 shows a basic circuit diagram of an example of an inductor-based configurable impedance matching network having balanced switches to accommodate a differential signal input, according to one embodiment of the present disclosure.

Referring to FIG. 2 and others, in various embodiments of the present invention, the frequency bandwidth of a transformer-based impedance matching network may be variably configured to match transmissions for multiple frequency bands by including at least one additional inductor, switchable either in series or in parallel to a primary main inductor 210 (Lpm), to tune impedance matching 200 to the center frequency of an additional operating frequency other than the tuned matching of base configuration with just primary and secondary main inductors 210, 220 (Lpm and Lsm). Utilizing switches 210 and 212, the additional inductor(s) may be energized or de-energized to effect impedance matching by altering the mutual inductance coupling to cause matching network 200 to match the source and load impedance when operating at the additional operating frequency desired.

In some embodiments, a transformer-based matching network 200 may include at least one additional primary inductor branch 214 and switch 212 to modify the impedance of the network. However, preferably, at least one additional secondary inductor branch 224 is also included and engaged by a respective switch 222 to tune matching network 200 to one or more additional operating frequencies. In some embodiments, where a differential input signal is received from the source such as a power amplifier, the additional primary inductor branch may include two switches 212 to input the differential signal to additional primary inductor 214 in a balanced fashion. By contrast, since the output to load 240 is a single output signal, only one switch 214 is needed to engage additional secondary inductor 224 for impedance matching at an additional frequency band. In this embodiment, the additional switchable inductor branches 214, 224 are configured in parallel to the respective primary and secondary inductors 210, 220.

Figure 3:
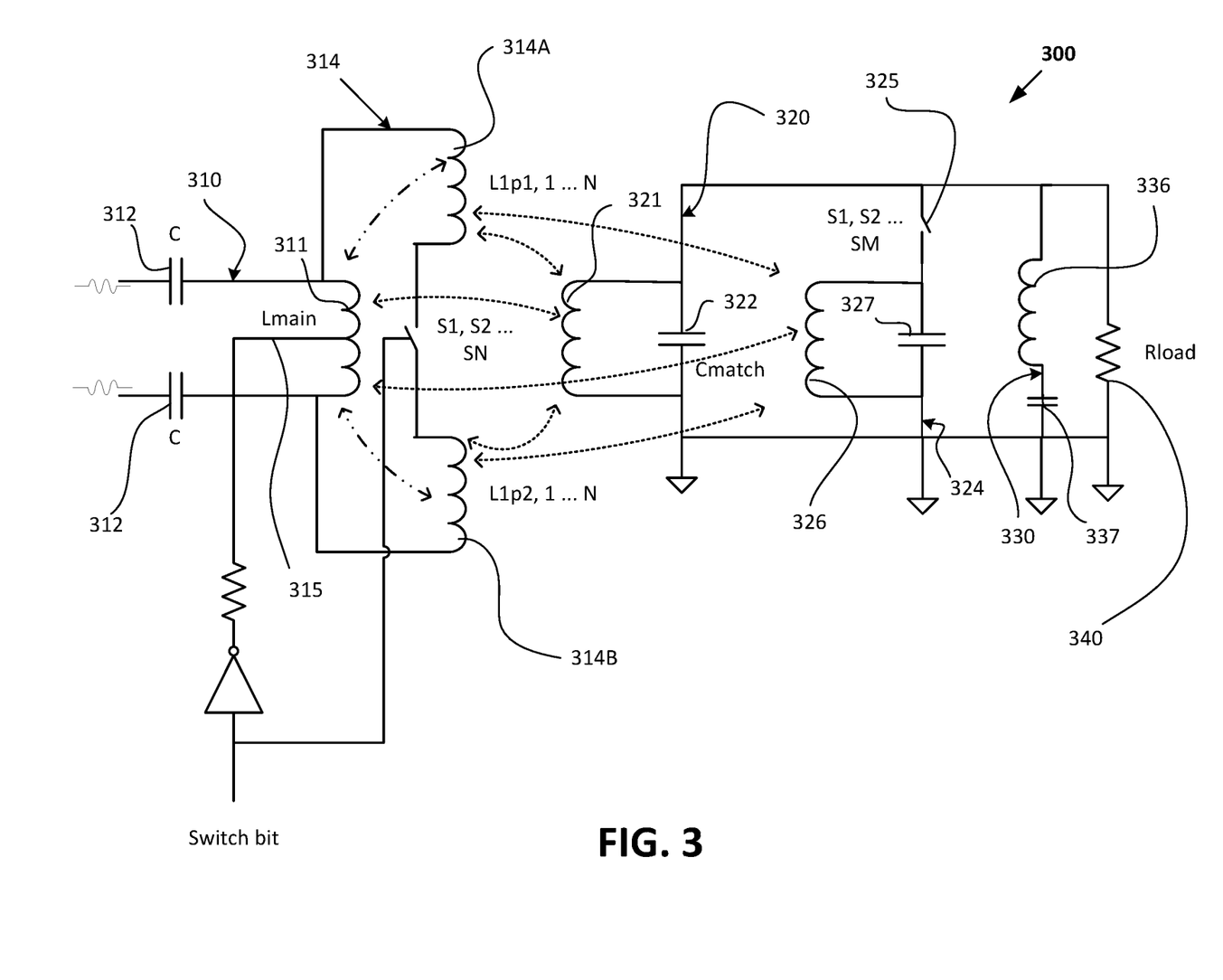
FIG. 3 shows a basic circuit diagram of an exemplary inductor-based matching network having a single switch configurable inductance according to another embodiment of the present disclosure.

Referring to FIG. 3, an alternate embodiment of a matching network 300 is shown. Here, the at least one additional primary inductor branch 314 may utilize two inductors 314A, 314B, preferably of the same value, and an NMOS switch S1 between these two inductors. This arrangement enables inductors 314A and 3148 to be energized and keep the differential input signals balanced. In one embodiment, a center-tap 315 of the main inductor is DC biased at a voltage between a supply voltage (VDD) and ground, e.g., VDD/2. A logic control bit may be used to apply the bias voltage to the relevant switch (S1

In some embodiments, matching network 300 includes at least one switchable secondary inductor branch 324 configured in parallel with a secondary side main inductor circuit 320. Secondary inductor branch 324 may be switched to dynamically adapt the mutual inductance of the primary and secondary sides of transformer-based impedance matching circuit 300 and thus change its impedance matching characteristics. In preferred embodiments, secondary inductor branch(es) 324 are switchable in coordination with primary switchable inductor branch(es) 314, although the embodiments are in no way so limited.

In this embodiment, the switchable secondary inductor branch 324 may include one inductor 325 and an NMOS switch 326 to dynamically engage inductor 325, altering the mutual inductance of circuit 300. Preferably, secondary inductor branch 324 includes a matching capacitor 327 in parallel similar to the main secondary coil circuit 320, i.e., inductor 321 and capacitor 322. Although shown in FIG. 3 on an opposite side, switch 326 may be disposed between inductor 325 and a respective ground. According to certain inventive embodiments, at least one inductor filter branch 330 is arranged in parallel with secondary inductor circuit 320 and secondary branch(es) 324. Filter branch circuit 330 preferably includes an inductor 335 in series with a capacitor 337 to form a harmonic filter at a secondary side output. Each filter branch 330 is not required to be switchable as are the primary and secondary branches 314, 324, though preferably, a filter branch configuration is included for each frequency of operation.

FIG. 3 also shows the biasing scheme for the switches according to various embodiments, where both NMOS or PMOS FETs could be used. For NMOS type transistors the "on" state, a switch bit at 1 would set to VDD and turn on the transistor. In an "off" state the gate is pulled to VSS and the drain and source terminals are biased to VDD. For a PMOS the biasing scheme can be applied vice versa.

Figure 4:
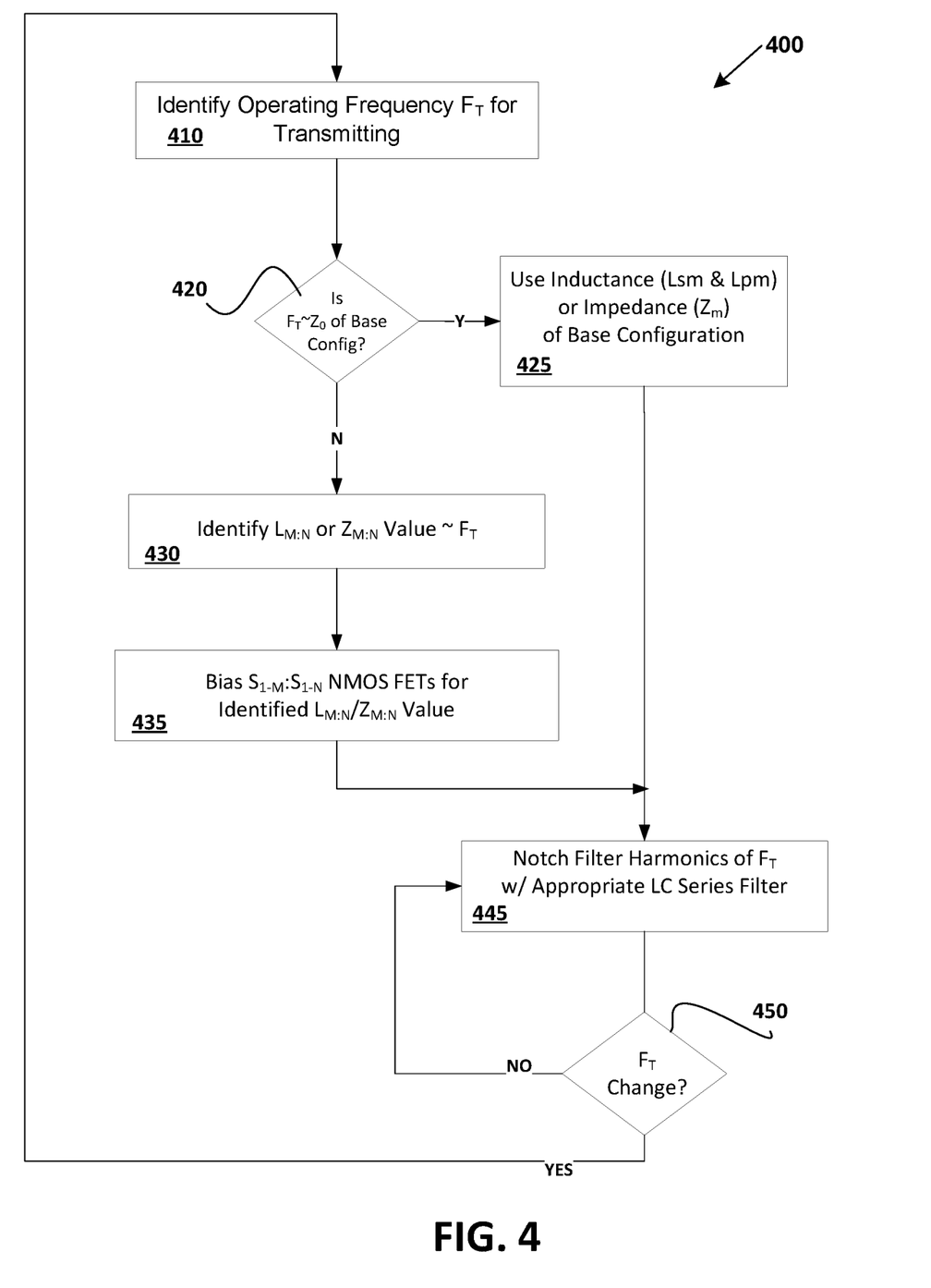
FIG. 4 illustrates an exemplary flow chart of a basic method for operating a wideband reconfigurable matching network according to certain embodiments of disclosure.

Referring to FIG. 4, a method 400 of dynamically adapting a transformer-based impedance matching network may generally include: determining 410 a frequency band for transmission ($F_T$); if 420 the frequency band $F_T$ is associated with (~) the base impedance configuration $Z_0$, the matching network is unaltered 425 and the harmonic filter associated with the transmit frequency band $F_T$ is used 445. If 420, however, the impedance of the matching network is other than a main or base configuration of the transformer-based impedance matching network, the appropriate matching impedance $Z_{M:N}$ or, the inductance $L_{m:N}$ necessary for transmission, is determined 430. This may be done simply by a look up table corresponding to the transmit frequency. Alternatively, it may be calculated. Once the primary Lsm+Lp1 . . . LpN and/or secondary configuration Lsm+Ls1 . . . LsM is known to match at the transmit frequency $F_T$, the appropriate primary and secondary (if any) inductor branches, are energized 435 by applying an appropriate voltage to the relevant switches S1, S2 . . . SN, and/or S1, S2 . . . SM to energize the respective primary or secondary additional inductor branches. In some embodiments, this is done by a control bit.

In some embodiments, at least two or more additional inductor branches are energized 435, including an additional primary side inductor branch and an additional secondary side inductor branch, to dynamically modify a mutual inductance of the transformer-based impedance matching network to impedance match at the second transmit frequency band; and notch filtering 445 harmonics of the second transmit frequency band at an output of the secondary side of the matching network until the transmission frequency $F_T$ changes 450.

In certain embodiments, the additional primary side inductor branch(es) are in parallel with a main primary inductor of the primary side, and the main primary inductor and additional primary side inductor branch(es) are coupled at each end, to a respective input of two differential source signal inputs via a series capacitor.

Utilizing features of the foregoing embodiments, a solution is provided that enables a matching network to dynamically increase the transmit frequency ranges which may be desired for wideband and multiband transmitter operation. That is, a configurable matching network is provided which may support two or more bands with very different center frequencies. For example, using the embodiments described herein, GSM frequencies of 850 and 900 MHz can be combined with 1800 and 1900 MHz very effectively on a single amplifier chain. Thus advantages of the inventive embodiments may result in significant reduction of on-chip surface area, and/or reduced power consumption since fewer amplifier chains are used to cover a large span in frequency ranges conventionally matched using a different matching network for each frequency band.

Figure 5:
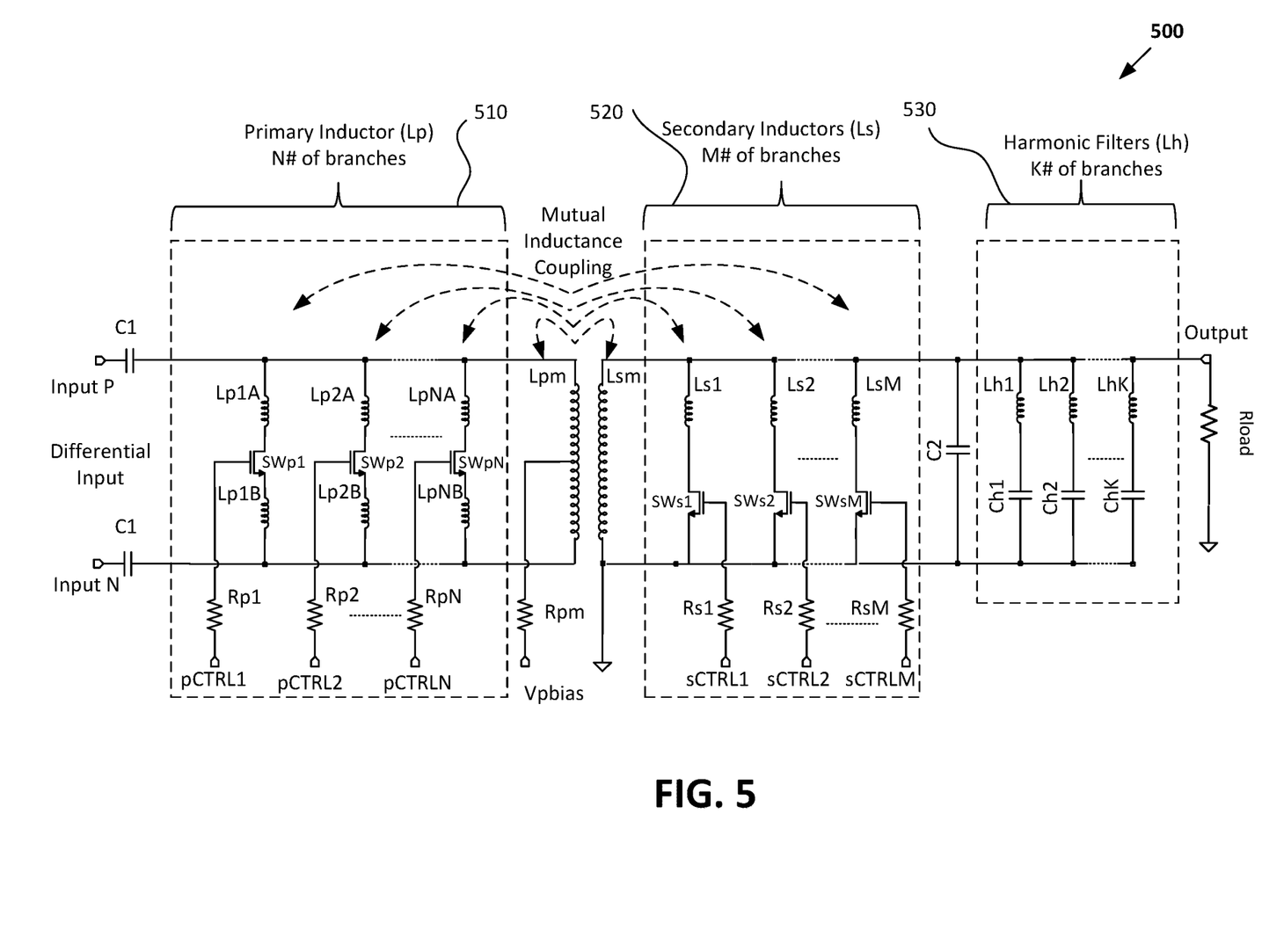
FIG. 5 shows a detailed circuit diagram of an exemplary embodiment of matching network reconfigurable to operate in four different operating frequencies, according to various embodiments.

In FIG. 5, the bandwidth of a transformer-based matching network 500, includes additional in-parallel inductors to enable a multiband and more wideband operation through a set of reconfigurable switches coupling the additional in-parallel inductors. In this and other embodiments, a center frequency of the matching network is primarily determined by the differential input side in-series capacitance C1 and the transformers main primary side inductance Lpm, and the output side capacitance C2 and main secondary side inductance Lsm.

With the introduction of at least one additional in-parallel inductor pair and switch branches 510 on the primary side and optionally, in-parallel inductor and switch branches 520 on the secondary side, the mutual inductance of a transformer-based matching network may be dynamically modified and multiband operation is achieved. FIG. 5 shows an exemplary schematic of transformer-based matching network 500 having switchable circuit including S1 . . . SN to energize additional parallel inductor pair branches 510 on the primary side. The primary side is connected to differential inputs from the source to the main primary inductor Lpm and additional primary inductors via switches (S1, S2 . . . SN). Differential input capacitors C1 are coupled in series with the primary side circuit, are chosen to resonate on the fundamental of the lower frequency band to be operated.

1 to M additional secondary parallel inductor branches 520 may include a single inductor in parallel with a respective capacitor and are coupled at one end to a secondary side main inductor Lsm output and at ground on an opposite end. Depending on the state of the 1 to N switches in primary side and 1 to M switches in secondary side, a number of the 1 to N parallel primary inductor pair branches 510 and equivalent number of 1 to M parallel secondary inductor branches 520 are activated, which effectively decreases both the primary inductance and secondary inductance. Thus, the resonance frequency is shifted up and the amount depends on the circuit elements chosen, as well as how many branches are used in various configurations.

Figure 6:
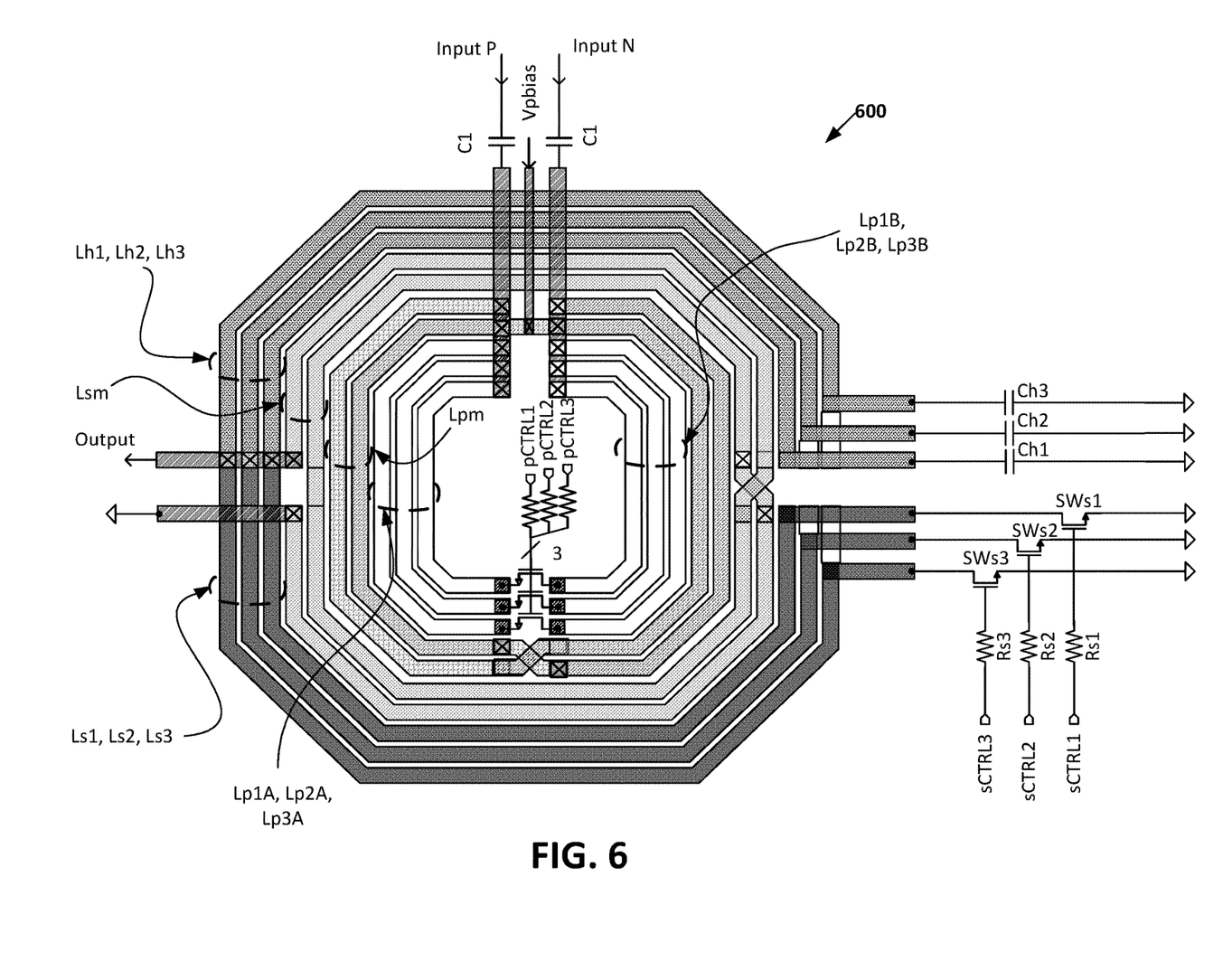
FIG. 6 illustrates an example microstrip implementation of a wideband reconfigurable matching network shown in the circuit diagram of FIG. 5.

Preferably, for the primary side inductor pair branches 510, two inductors as a pair are identical to each other. Each of the two inductors have one terminal connected to the Lpm and another terminal connected to the NMOS switch S1-SN. In preferred embodiments, these two inductors have a same value and are symmetric in the physical layout. On the primary side, the signal are in differential mode and have a symmetric impedance from the inductor pair in each branch. For the secondary side inductance branches 520 are coupled to a single-ended output (with the opposite to ground) and thus symmetric impedance is not a concern. As can be seen in FIG. 6, the parallel inductors can be winding laterally outside in lower part of the matching network strip layout. Matching network may include 1 to K inductor windings Lh1 . . . LhK, to form harmonic filters branches 530 to notch out different harmonics with the respective series capacitors having different values suitably selected for resonating at the different operating frequencies/frequency bands.

As shown, a center tap of the primary side main inductor Lpm provides a DC bias in-between the supply (VDD) and ground, e.g., VDD/2. The channel of switches SWp1-SWpN in all the primary side branches 510 are all DC biased at VDD/2, via the Lpm, Lp1A-LpNA and Lp1B-LpNB metal windings. If any of the primary side branches 510 switch control is logic 1, the gate of the NMOS is VDD, the switch is in an "on" state and the branch inductor pair is energized. The energized primary branch 520 reduces the primary side inductance. If any of the primary side branches switch control is logic 0, the gate of the NMOS is ground, the switch is in an "off" state and the branch inductor pair 520 is not energized and thus has no effects on the primary side inductance Lpm.

To enable high output power, the secondary side voltage swing may be made larger than primary side voltage swing. For example, the secondary side switches (SWs1, SWs2, . . . , SWsM) have source terminals constantly tied to ground (no swings). If any of the secondary side branch switch controls is logic 0, the corresponding NMOS switches (SWs) gate is 0. The override voltage of the switch is at 0, and is independent of the large voltage swing of the output signal. At this voltage, the secondary branch switch has good isolation, acts as an open circuit, and remains in an "off" state. If any of the secondary side branch 520 switch controls is logic 1, the gate of the corresponding NMOS switches becomes VDD and the override voltage is VDD, at which the switch has good conductivity, like a short circuit. The branch inductance is electrically in-parallel with the secondary side main inductor and thus reduces secondary side total inductance.

In certain implementations, as best seen in microstrip circuit 600 of FIG. 6, the two inductors (Lp1A and Lp1B) in each primary side branch may have windings laterally disposed inside the primary side main inductor (Lpm) to maintain symmetry and the NMOS switch in each branch is located in between the two same value inductors Lp1A-Lp1B thru LpNA-LpNB of each branch (note 3 are shown). The inductors, Ls1 . . . Ls3, in each switchable secondary side parallel branch may preferably be windings laterally disposed outside the secondary main inductor Lsm winding and kept on a lower side. Further, the inductors Lh1 . . . Lh3 in each secondary side harmonic filter branch are arranged windings laterally outside of the secondary main inductor windings and kept in an upper side of circuit 600. Utilizing compact windings of the primary side inductance branches, the secondary side inductance branches, and the harmonic filter inductance branches with the primary side and secondary side main inductors respectively, significantly improves the layout are efficiency for the on-chip matching.

In the layout, each of the branch inductor is winding with the current flow direction opposite with the secondary main inductor to enhance the inductance value to each other. Each of the harmonic inductor is winding with the current flow direction same as the secondary main inductor to have small value to resonance with the capacitance (Ch1, Ch2, . . . , CHK) at much higher frequency for harmonics. Compact windings of the primary side inductance branches, the secondary side inductance branches, and the harmonic filter inductance branches with the primary side and secondary side main inductors significantly improves the layout are efficiency for the on-chip matching.

Figure 71:
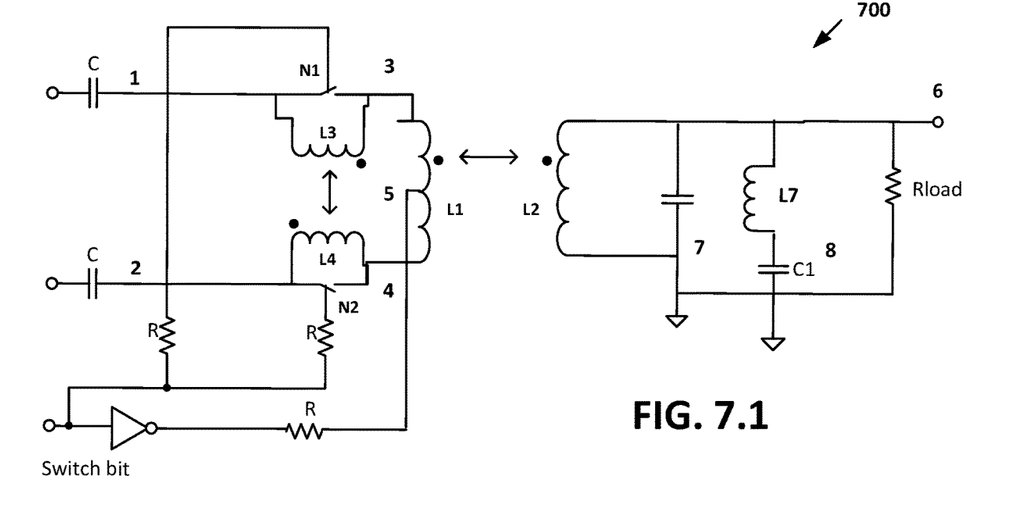
Figure 72:
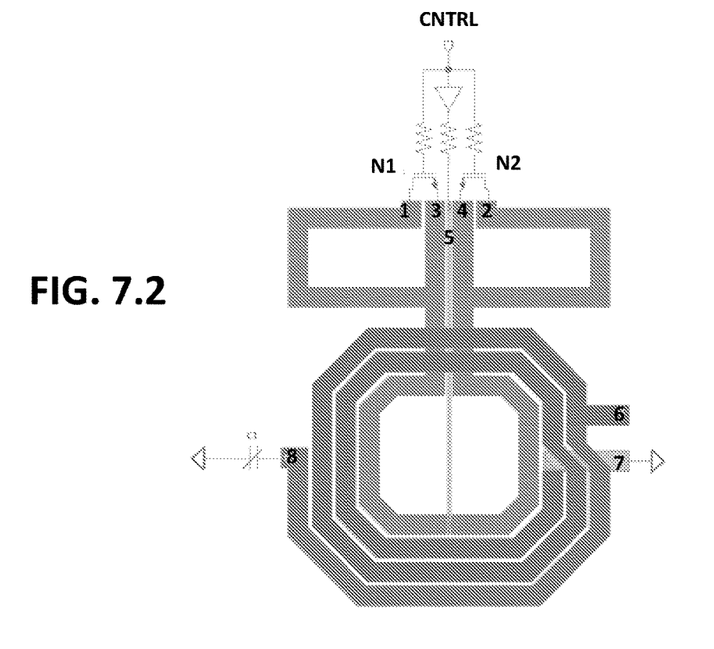

FIGS. 7.1 and 7.2 show another possible embodiment for a reconfigurable wideband matching network 700. In this embodiment, additional primary inductors L3 and L4 are switchably coupled to the main primary inductor L1 in a series configuration instead of parallel. Port 1 and 2 are the differential mode primary inputs. Port 6 is the secondary single-ended output put with port 7 as the secondary ground. The winding L7 from port 6 to port 8 serves as harmonic notch filter (resonance at harmonic frequency with in-series C1). The metal winding between port 1 and 3 corresponds to the L3 in FIG. 5, and the metal winding between port 2 and 4 corresponds to the L4 in FIG. 5. If the control is set to logic high (voltage potential is higher than NMOS threshold voltage), the NMOS (N1 and N2) switch gates are biased at high voltage potential. The inverter outputs logic low and the primary side center tap (Port 5) is biased as low voltage potential. Port 1, 2, 3 and 4 have same DC bias as port 5 (coupled through primary side metal windings). They are biased at low DC voltage. The N1 and N2 are closed (gate—channel cross voltage is positive and higher than threshold voltage). The L3 and L4 are shunted out from the primary side. The matching network primary side is resonant at high frequency band (resonance by C/2 and L1).

If the control is set to logic low, similarly, the N MOS (N1 and N2) gates are biased at low voltage. The port 1, 2, 3 and 4 are biased at high voltage. N1 and N2 are open. The L3 and L4 are in-series with L1. The matching network resonant at low frequency band (resonance by C2/2 and L1+L3+L4). The L3 and L4 can be multiple turn windings and cross-coupled with each other to improve the space efficiency.

Figure 8:
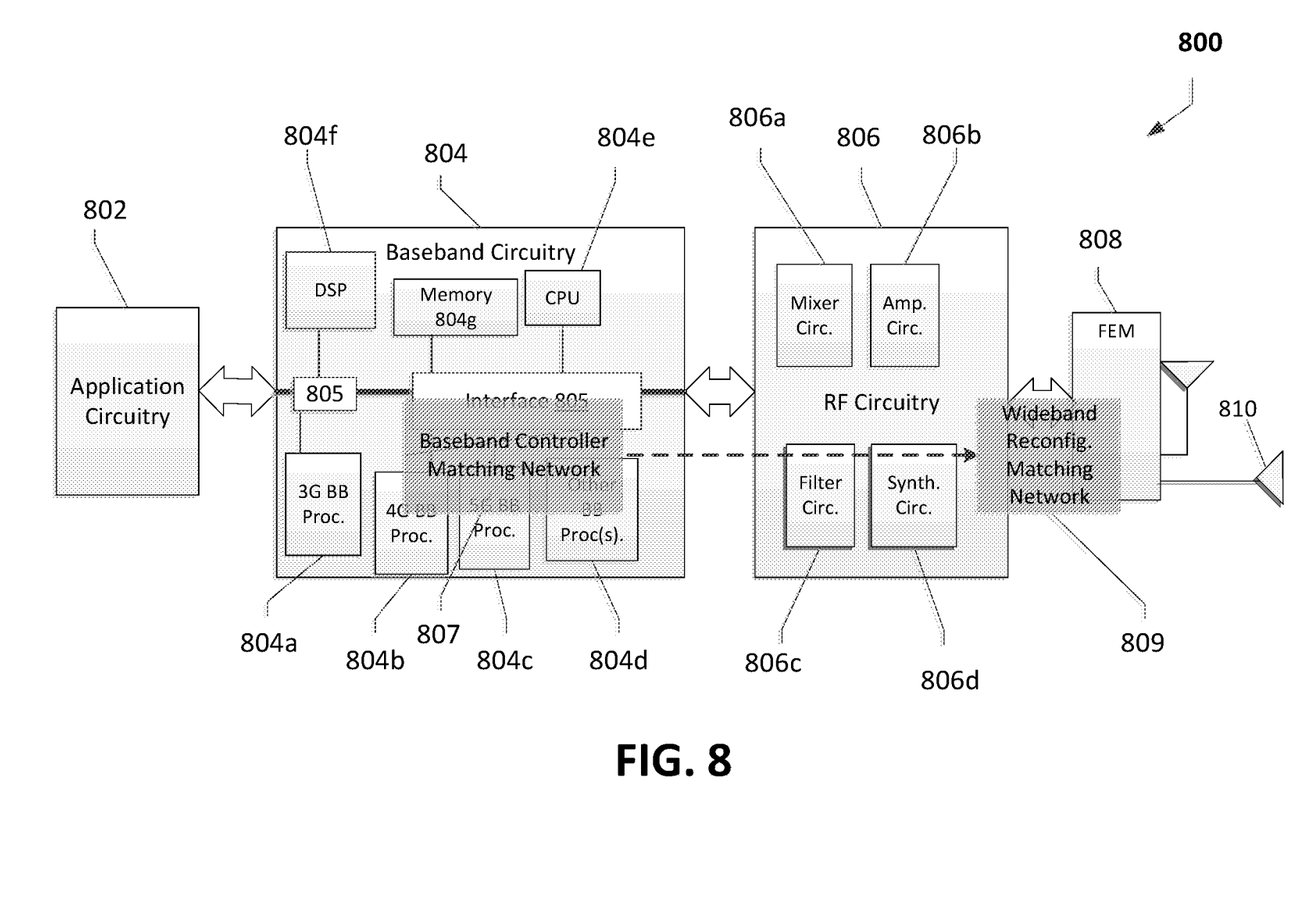
FIG. 8 shows an example block diagram of a wireless device such as user equipment (UE) including a wideband reconfigurable matching network of the various embodiments of the disclosure.

Referring to FIG. 8, a wireless communication device 800 configured to use carrier aggregation and determining timing differences between a PCell and SCells will now be described. As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 8 illustrates, for one embodiment, example components of an electronic device 800. In embodiments, the electronic device 800 may be, implement, be incorporated into, or otherwise be a part of a user equipment (UE). In some embodiments, the electronic device 800 may include application circuitry 802, baseband circuitry 804, Radio Frequency (RF) circuitry 806, front-end module (FEM) circuitry 808 and one or more antennas 810, coupled together at least as shown. Electronic device 800 may include interconnects (shown by arrows and dark lines) such as PCIe, Advanced eXtensible Interconnect (AXI) or open core protocol (OCP) or the like to exchange information and/or signals between a host, various peripherals or sub-peripherals, referred to as components. And each component using the interconnect, must have an interface 805 to do so.

The application circuitry 802 may include one or more application processors or processing units. For example, the application circuitry 802 may include circuitry such as, but not limited to, one or more single-core or multi-core processors 802a. The processor(s) 802a may include any combination of general-purpose processors and dedicated processors (e.g., graphics processors, application processors, etc.). The processors 802a may be coupled with and/or may include computer-readable media 802b (also referred to as "CRM 802b", "memory 802b", "storage 802b", or "memory/storage 802b") and may be configured to execute instructions stored in the CRM 802b to enable various applications and/or operating systems to run on the system and/or enable features of the inventive embodiments to be enabled.

The baseband circuitry 804 may include circuitry such as, but not limited to, one or more single-core or multi-core processors to arrange, configure, process, generate, transmit, receive, or otherwise determine time differences of carrier aggregation signals as described in various embodiments herein. The baseband circuitry 804 may include one or more baseband processors and/or control logic to process baseband signals received from a receive signal path of the RF circuitry 806 via an interconnect interface 805 and to generate baseband signals for a transmit signal path of the RF circuitry 806. Baseband circuity 804 may also interface 805 via an interconnect, with the application circuitry 802 for generation and processing of the baseband signals and for controlling operations of the RF circuitry 806. For example, in some embodiments, the baseband circuitry 804 may include a third generation (3G) baseband processor 804a, a fourth generation (4G) baseband processor 804b, a fifth generation (5G)/NR baseband processor 804*c*, and/or other baseband processor(s) 804*d* for other existing generations, generations in development or to be developed in the future (e.g., 6G, etc.). The baseband processing circuit 804 (e.g., one or more of baseband processors 804*a*-*d*) may handle various radio control functions that enable communication with one or more radio networks via the RF circuitry 806. The radio control functions may include, but are not limited to, signal modulation/demodulation, encoding/decoding, radio frequency shifting, as well as measuring time difference between carrier aggregation signals as discussed previously. In some embodiments, modulation/demodulation circuitry of the baseband circuitry 804 may include Fast-Fourier Transform (FFT), precoding, and/or constellation mapping/demapping functionality. In some embodiments, encoding/decoding circuitry of the baseband circuitry 804 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 804 may include elements of a protocol stack such as, for example, elements of an evolved universal terrestrial radio access network (E-UTRAN) protocol including, for example, physical (PHY), media access control (MAC), radio link control (RLC), packet data convergence protocol (PDCP), and/or radio resource control (RRC) elements. A central processing unit (CPU) 804*e* of the baseband circuitry 804 may be configured to run elements of the protocol stack for signaling of the PHY, MAC, RLC, PDCP and/or RRC layers. In some embodiments, the baseband circuitry may include one or more digital signal processor(s) (DSP) 804*f* for audio processing. The DSP(s) 804*f* may include elements for compression/decompression and echo cancellation and may include other suitable processing elements in other embodiments. The baseband circuitry 804 may further include computer-readable media 804*g* (also referred to as "CRM 804*g*", "memory 804*g*", or "storage 804*g*"). The CRM 804*g* may be used to load and store data and/or instructions for operations performed by the processors of the baseband circuitry 804. CRM 804*g* for one embodiment may include any combination of suitable volatile memory and/or non-volatile memory. The CRM 804*g* may include any combination of various levels of memory/storage including, but not limited to, read-only memory (ROM) having embedded software instructions (e.g., firmware), random access memory (e.g., dynamic random access memory (DRAM)), cache, buffers, etc.). The CRM 804*g* may be shared among the various processors or dedicated to particular processors. Components of the baseband circuitry 804 may be suitably combined in a single chip, a single chipset, or disposed on a same circuit board in some embodiments. In some embodiments, some or all of the constituent components of the baseband circuitry 804 and the application circuitry 802 may be implemented together, such as, for example, on a system on a chip (SOC).

In some embodiments, the baseband circuitry 804 may provide for communication compatible with one or more radio technologies. For example, in some embodiments, the baseband circuitry 804 may support communication with an E-UTRAN, NR and/or other wireless metropolitan area networks (WMAN), a wireless local area network (WLAN), a wireless personal area network (WPAN). Embodiments in which the baseband circuitry 804 is configured to support radio communications of more than one wireless protocol may be referred to as multi-mode baseband circuitry.

RF circuitry 806 may enable communication with wireless networks using modulated electromagnetic radiation through a non-solid medium. In various embodiments, the RF circuitry 806 may include switches, filters, amplifiers, etc., to facilitate the communication with the wireless network. RF circuitry 806 may include a receive signal path that may include circuitry to down-convert RF signals received from the FEM circuitry 808 and provide baseband signals to the baseband circuitry 104. RF circuitry 806 may also include a transmit signal path that may include circuitry to up-convert baseband signals provided by the baseband circuitry 804 and provide RF output signals to the FEM circuitry 808 for transmission.

In some embodiments, the RF circuitry 806 may include a receive signal path and a transmit signal path. The receive signal path of the RF circuitry 806 may include mixer circuitry 806*a*, amplifier circuitry 806*b* and filter circuitry 806*c*. The transmit signal path of the RF circuitry 806 may include filter circuitry 806*c* and mixer circuitry 806*a*. RF circuitry 806 may also include synthesizer circuitry 806*d* for synthesizing a frequency for use by the mixer circuitry 806*a* of the receive signal path and the transmit signal path. In some embodiments, the mixer circuitry 806*a* of the receive signal path may be configured to down-convert RF signals received from the FEM circuitry 808 based on the synthesized frequency provided by synthesizer circuitry 806*d*. The amplifier circuitry 806*b* may be configured to amplify the down-converted signals and the filter circuitry 806*c* may be a low-pass filter (LPF) or band-pass filter (BPF) configured to remove unwanted signals from the down-converted signals to generate output baseband signals. Output baseband signals may be provided to the baseband circuitry 804 for further processing. In some embodiments, the output baseband signals may be zero-frequency baseband signals, although this is not a requirement. In some embodiments, mixer circuitry 806*a* of the receive signal path may comprise passive mixers, although the scope of the embodiments is not limited in this respect.

In some embodiments, the mixer circuitry 806*a* of the transmit signal path may be configured to up-convert input baseband signals via interconnect and based on the synthesized frequency provided by the synthesizer circuitry 806*d* to generate RF output signals for the FEM circuitry 808. The baseband signals may be provided by the baseband circuitry 804 and may be filtered by filter circuitry 806*c*. The filter circuitry 806*c* may include a low-pass filter (LPF), although the scope of the embodiments is not limited in this respect.

In some embodiments, the mixer circuitry 806*a* of the receive signal path and the mixer circuitry 806*a* of the transmit signal path may include two or more mixers and may be arranged for quadrature downconversion and/or upconversion, respectively. In some embodiments, the mixer circuitry 806*a* of the receive signal path and the mixer circuitry 806*a* of the transmit signal path may include two or more mixers and may be arranged for image rejection (e.g., Hartley image rejection). In some embodiments, the mixer circuitry 806*a* of the receive signal path and the mixer circuitry 806*a* of the transmit signal path may be arranged for direct downconversion and/or direct upconversion, respectively. In some embodiments, the mixer circuitry 806*a* of the receive signal path and the mixer circuitry 806*a* of the transmit signal path may be configured for super-heterodyne operation.

In some embodiments, the output baseband signals and the input baseband signals may be analog baseband signals which are digitally converted to provide digital data to processors via interface 805 to through the interconnect, although the scope of the embodiments is not limited in this respect. In some alternate embodiments, the output baseband signals and the input baseband signals may be digital baseband signals. In these alternate embodiments, the RF circuitry 806 may include analog-to-digital converter (ADC) and digital-to-analog converter (DAC) circuitry and the baseband circuitry 804 may include an RF interface 805, such as an analog or digital baseband interface, to communicate with the RF circuitry 806.

In dual-mode embodiments, a separate radio IC circuitry may be provided for processing signals for each spectrum, although the scope of the embodiments is not limited in this respect.

In some embodiments, the synthesizer circuitry 806d may be a fractional-N synthesizer or a fractional N/N+1 synthesizer, although the scope of the embodiments is not limited in this respect, as other types of frequency synthesizers may be suitable. For example, synthesizer circuitry 806d may be a delta-sigma synthesizer, a frequency multiplier, or a synthesizer comprising a phase-locked loop with a frequency divider. The synthesizer circuitry 806d may be configured to synthesize an output frequency for use by the mixer circuitry 806a of the RF circuitry 806 based on a frequency input and a divider control input. In some embodiments, the synthesizer circuitry 806d may be a fractional N/N+1 synthesizer.

In some embodiments, frequency input may be provided by a voltage controlled oscillator (VCO), although that is not a requirement. Divider control input may be provided by either the baseband circuitry 804 or the application circuitry 802 depending on the desired output frequency. In some embodiments, a divider control input (e.g., N) may be determined from a look-up table based on a channel indicated by the application circuitry 802.

Synthesizer circuitry 806d of the RF circuitry 806 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 806d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 806 may include an IQ/polar converter.

FEM circuitry 808 may include a receive signal path that may include circuitry configured to operate on RF signals received from one or more antennas 810, amplify the received signals and provide the amplified versions of the received signals to the RF circuitry 806 for further processing. FEM circuitry 808 may also include a transmit signal path that may include circuitry configured to amplify signals for transmission provided by the RF circuitry 806 for transmission by one or more of the one or more antennas 810. In some embodiments, the FEM circuitry 808 may include a TX/RX switch to switch between transmit mode and receive mode operation. The FEM circuitry 808 may include a receive signal path and a transmit signal path. The receive signal path of the FEM circuitry may include a low-noise amplifier (LNA) to amplify received RF signals and provide the amplified received RF signals as an output (e.g., to the RF circuitry 806). The transmit signal path of the FEM circuitry 808 may include a power amplifier (PA) to amplify input RF signals (e.g., provided by RF circuitry 806), and one or more filters to generate RF signals for subsequent transmission (e.g., by one or more of the one or more antennas 810).

In some embodiments, the electronic device 800 may include additional elements such as, for example, a display, a camera, one or more sensors, and/or interface 805 to interconnect (for example, input/output (I/O) interfaces or buses). In embodiments where the electronic device is implemented to provide networking functions, the electronic device 800 may include network interface circuitry. The network interface circuitry may be one or more computer hardware components that connect electronic device 800 to one or more network elements, such as one or more servers within a core network via one or more wired connections. To this end, the network interface circuitry may include one or more dedicated processors and/or field programmable gate arrays (FPGAs) to communicate using one or more network communications protocols such as X2 application protocol (AP), S1 AP, Stream Control Transmission Protocol (SCTP), Ethernet, Point-to-Point (PPP), Fiber Distributed Data Interface (FDDI), and/or any other suitable network communications protocols.

As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more." "Interface" may simply be a connector or bus wire through which signals are transferred, including one or more pins on an integrated circuit.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

EXAMPLE EMBODIMENTS

According to a First Example embodiment, an apparatus is defined including an impedance matching network to match a differential signal source having a source impedance (ZS), with a load having a load impedance (ZL). The impedance matching network including: a differential input to couple with said differential signal source; a transformer impedance matching circuit coupled with, and in parallel to, the differential input circuit, the transformer impedance matching circuit including a primary main inductor having a first mutual inductance coupling with a secondary main inductor and configured to match said load impedance and said source impedance over a first operating frequency range; an LC harmonic filter circuit coupled with, and in parallel to, the secondary main inductor and having components selected to resonate at a frequency within the first operating frequency range; and at least one additional inductor branch switchably coupled to said primary and secondary main inductors, respectively, said additional inductor branches, when engaged, dynamically adapt the transformer impedance matching circuit to have a second mutual inductance to match the load impedance and the source impedance over a second operating frequency range.

In a Second Example embodiment, the First Example is further defined by at least one additional LC filter branch switchably coupled to, and in parallel with, the LC harmonic filter circuit, the at least one additional LC filter branch selected to resonate at a frequency within the second operating frequency range;

A Third Example further defines the First wherein the at least one additional inductor branch coupled to the differential input circuit and the primary main inductor comprises a single inductor in parallel to the primary main inductor and switchably connected by two field-effect transistor (FET) switches, one FET switch on each side of the single parallel inductor, to engage said single parallel inductor in a balanced fashion via the differential input circuit.

A Fourth Example may expand on the First Example wherein the at least one additional inductor branch coupled to the primary main inductor comprises two same value inductors in parallel with the primary main inductor and switchably connected by a single switch disposed between the two same value inductors and biased from a center tap of the primary main inductor.

In a Fifth Example, any of the First thru Fourth Examples are furthered, wherein switchably connected comprises connected via a metal oxide semiconductor field effect transistor (MOSFET) using N-type or P-type material.

In a Sixth Example, the First through Fourth Examples may include the impedance matching network is formed as a microstrip circuit.

According to a Seventh Example embodiment the Second through Fourth Examples are furthered by the apparatus comprises two additional inductor branches and two additional LC branches, and configured to operate in the first, second and a third operating frequency range.

An Eighth Example furthers the First in that the apparatus comprises an analog front end module including the impedance matching network.

In an Ninth Example, the Seventh Example further comprises a baseband processor coupled to the analog front end module and configured to control the impedance matching networks switching of the additional inductor branches.

A Tenth Example defines an apparatus including a transformer-based impedance matching network comprising: a primary side transformer circuit including a primary inductor configured to provide impedance matching over a first frequency band, and one or more additional primary inductor branches coupled to the primary inductor via one or more switches to dynamically adapt impedance matching for one or more additional frequency bands; a secondary side transformer circuit arranged to be inductively coupled to the primary side transformer circuit and including a secondary inductor configured to impedance matching over the first frequency band, and one or more additional secondary inductor branches coupled to the secondary inductor via one or more switches to dynamically adapt impedance matching for the one or more additional frequency bands; and an LC filter circuit coupled to an output of the secondary side transformer circuit and including an inductor and a capacitor in series and configured to notch-filter harmonic frequencies within the first frequency band, and one or more additional LC circuit branches coupled to the output via one or more switches to dynamically adapt the LC filter circuit to notch-filter different harmonic frequencies over the one or more additional frequency bands.

An Eleventh Example furthers the Tenth wherein the one or more additional primary inductor branches are in parallel to the primary inductor and each comprise two same value inductors and a corresponding switch between, to energize the two same value inductors in a balanced fashion.

In a Twelfth Example, the Tenth Example is further by the one or more additional primary inductor branches are mutually inductive to another and in series with the primary inductor.

According to a Thirteenth Example, the Tenth through Twelfth Examples are furthered in that there are two additional primary inductor branches, two additional secondary inductor branches and two additional LC circuit branches, to dynamically adapt impedance matching to a plurality of different frequency bands.

In a Fourteenth Example, the Thirteenth includes the transformer-based impedance matching network is configured as a microstrip circuit, and wherein the three different frequency bands A Fifteenth Example furthers the Tenth through Twelfth Examples wherein the switches are metal oxide semiconductor field effect transistors (MOSFETs).

In a Sixteenth Example, the Fifteenth is furthered when the MOSFETs are N-type and biased on by a center tap voltage from the primary inductor.

In an Eighteenth Example, the computer readable tangible medium includes instructions that, when executed by a processor, cause the processor to adapt a transformer-based impedance matching network to match a differential source signal having an impedance ZS to a load having an impedance ZL over a plurality of operating frequencies by performing the steps of: determining a frequency (FT) of the differential source signal; and dynamically switching the matching network between one of a plurality of impedance matching configurations comprising: a base configuration including a main primary inductor inductively coupled to, a proximate and parallel located, main secondary inductor when the frequency FT is within a first operating frequency band; and a second configuration including the base configuration and an additional primary inductor branch, in parallel and coupled to, the main primary inductor when FT is within a second operating frequency band.

In a Nineteenth Example, the Seventeenth Example is further defined wherein the second configuration further comprises an additional secondary inductor branch comprising an inductor and a parallel capacitor, the additional secondary inductor branch coupled to an output of, and in parallel to, the main secondary inductor, and ground.

In a Twentieth Example, the Seventeenth is furthered by the plurality of impedance matching configurations further comprise: a third configuration including the second configuration, a second additional primary inductor branch, in parallel and coupled to, the additional primary inductor branch, and a second additional secondary inductor branch including an inductor and a parallel capacitor, the second additional secondary inductor branch coupled in parallel to the additional secondary inductor branch, the second additional inductor branches switchably engaged when the frequency FT is within a third operating frequency band.

In a Twenty-First Example, the Seventeenth through Nineteenth include, wherein the processor comprises a baseband processor and the matching network comprises at least part of an analog front end (AFE) module of a user equipment (UE).

In a Twenty-Second Example embodiment, the Seventeenth through Nineteenth are furthered by the matching network further including one or more filter branches in parallel with the secondary inductor branch, each comprising an inductor coupled to an output of the main secondary conductor in series with a capacitor coupled to ground, each filter branch selected to notch filter harmonics within one of first second or third operating frequency bands.

According to a Twenty-Third Example, the Seventeenth through Nineteenth are furthered by additional primary inductor branches each comprising two same value inductors symmetrically arranged in series, each one disposed on opposite sides of an NMOS switch.

In a Twenty-Fourth Example a communication device includes a transformer-based impedance matching network adapted to operate over three or more different frequency bands. The communication device comprises: a power amplifier circuit configured to provide a differential transmit signal over said least three different transmit frequency bands; one or more antennas to transmit and/or receive over the at least three different transmit frequency bands; and an impedance matching network coupling the power amplifier circuit to the one or more antennas, the matching network dynamically adaptable to impedance match over the three or more different frequency bands and comprising: a primary side inductor circuit having a main primary inductor and one or more additional primary inductor branches each including a switch to modify impedance of the matching network for a given operating frequency; a secondary side inductor circuit having a main secondary inductor and one or more additional secondary inductor branches each including a switch to modify impedance of the matching network for said given operating frequency; and a plurality of LC harmonic filter branches, one for each operating frequency.

In a Twenty-Fifth Example, the Twenty-Third is furthered by the matching network is implemented as a microstrip circuit.

According to a Twenty-Sixth Example embodiment, the Twenty-Third is furthered by each switch being an NMOS FET and wherein each additional primary inductor branch is parallel to the main primary inductor and comprises two same value inductors symmetrically disposed on opposite side of the switch, A Twenty-Seven Example embodiment defines means for matching a differential source signal having an impedance $Z_S$ to a load having an impedance $Z_L$ over a plurality of operating frequencies including means for determining a frequency ($F_T$) of the differential source signal; and means for dynamically switching the matching network between one of a plurality of impedance matching configurations including: a base configuration including a main primary inductor inductively coupled to, a proximate and parallel located, main secondary inductor when the frequency FT is within a first operating frequency band; and a second configuration including the base configuration and an additional primary inductor branch, in parallel and coupled to, the main primary inductor when FT is within a second operating frequency band.

A Twenty-Eighth Example includes a method for adapting a transformer-based impedance matching network to match a source impedance to a load impedance over a plurality of operating frequencies including: determining a frequency ($F_T$) of the differential source signal; and dynamically switching the matching network between one of a plurality of impedance matching configurations comprising: a base configuration including a main primary inductor inductively coupled to, a proximate and parallel located, main secondary inductor when the frequency $F_T$ is within a first operating frequency band; and a second configuration including the base configuration and an additional primary inductor branch, in parallel and coupled to, the main primary inductor when FT is within a second operating frequency band.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The present disclosure has been described with reference to the attached drawing figures, with certain example terms and wherein like reference numerals are used to refer to like elements throughout. The illustrated structures, devices and methods are not intended to be drawn to scale, or as any specific circuit or any in any way other than as functional block diagrams to illustrate certain features, advantages and enabling disclosure of the inventive embodiments and their illustration and description is not intended to be limiting in any manner in respect to the appended claims that follow, with the exception of 35 USC 112, sixth paragraph, claims using the literal words "means for," if present in a claim. As utilized herein, the terms "component," "system," "interface," "logic," "circuit," "device," and the like are intended only to refer to a basic functional entity such as hardware, processor designs, software (e.g., in execution), logic (circuits or programmable), firmware alone or in combination to suit the claimed functionalities. For example, a component, module, circuit, device or processing unit "configured to," "adapted to" or "arranged to" may mean a microprocessor, a controller, a programmable logic array and/or a circuit coupled thereto or other logic processing device, and a method or process may mean instructions running on a processor, firmware programmed in a controller, an object, an executable, a program, a storage device including instructions to be executed, a computer, a tablet PC and/or a mobile phone with a processing device. By way of illustration, a process, logic, method or module can be any analog circuit, digital processing circuit or combination thereof. One or more circuits or modules can reside within a process, and a module can be localized as a physical circuit, a programmable array, a processor. Furthermore, elements, circuits, components, modules and processes/methods may be hardware or software, combined with a processor, executable from various computer readable storage media having executable instructions and/or data stored thereon. Those of ordinary skill in the art will recognize various ways to implement the logical descriptions of the appended claims and their interpretation should not be limited to any example or enabling description, depiction or layout described above, in the abstract or in the drawing figures.

What is claimed:

1. An apparatus including an impedance matching network to match a differential signal source having a source impedance (ZS), with a load having a load impedance (ZL), the impedance matching network comprising:
   a differential input to couple with said differential signal source;
   a transformer impedance matching circuit coupled to the differential input circuit, the transformer impedance matching circuit including a primary main inductor having a first mutual inductance coupling with a secondary main inductor and configured to match said load impedance and said source impedance over a first operating frequency range;
   an inductor capacitor (LC) harmonic filter circuit coupled to the secondary main inductor and having components selected to resonate at a frequency within the first operating frequency range;
   at least one additional inductor branch switchably coupled to said primary and secondary main inductors, respectively, said additional inductor branches, when engaged, adapt the transformer impedance matching circuit to have a second mutual inductance to match the load impedance and the source impedance over a second operating frequency range; and
   at least one additional LC filter branch switchably coupled to, and in parallel with, the LC harmonic filter circuit, the at least one additional LC filter branch selected to resonate at a frequency within the second operating frequency range.

2. The apparatus of claim 1 wherein the apparatus comprises two additional inductor branches and two additional LC branches, and configured to operate in the first, second and a third operating frequency range.

3. The apparatus of claim 1 wherein the at least one additional inductor branch coupled to the differential input circuit and the primary main inductor comprises a single inductor in parallel to the primary main inductor and switchably connected by two field-effect transistor (FET) switches, one FET switch on each side of the single parallel inductor, to engage said single parallel inductor in a balanced fashion via the differential input circuit.

4. The apparatus of claim 1 wherein the at least one additional inductor branch coupled to the primary main inductor comprises two same value inductors in parallel with the primary main inductor and switchably connected by a single switch disposed between the two same value inductors and biased from a center tap of the primary main inductor.

5. The apparatus of claim 1 wherein switchably connected comprises connected via a metal oxide semiconductor field effect transistor (MOSFET) using N-type or P-type material.

6. The apparatus of claim 1 wherein the impedance matching network is formed as a microstrip circuit.

7. The apparatus of claim 2 wherein the apparatus further comprises a baseband processor coupled to the analog front end module and configured to control the impedance matching networks switching of the additional inductor branches.

8. The apparatus of claim 1 wherein the apparatus comprises an analog front end module including the impedance matching network.

9. An apparatus including a transformer-based impedance matching network comprising:
   a primary side transformer circuit including a primary inductor configured to provide impedance matching over a first frequency band, and one or more additional primary inductor branches coupled to the primary inductor via one or more switches to dynamically adapt impedance matching for one or more additional frequency bands;
   a secondary side transformer circuit arranged to be inductively coupled to the primary side transformer circuit and including a secondary inductor configured to impedance matching over the first frequency band, and one or more additional secondary inductor branches coupled to the secondary inductor via one or more switches to dynamically adapt impedance matching for the one or more additional frequency bands; and
   an inductor capacitor (LC) filter circuit coupled to an output of the secondary side transformer circuit and including an inductor and a capacitor in series and configured to notch-filter harmonic frequencies within the first frequency band, and one or more additional LC circuit branches coupled to the output via one or more switches to dynamically adapt the LC filter circuit to notch-filter different harmonic frequencies over the one or more additional frequency bands.

10. The apparatus of claim 9 wherein the switches are metal oxide semiconductor field effect transistors (MOSFETs).

11. The apparatus of claim 9 wherein the one or more additional primary inductor branches are in parallel to the primary inductor and each comprise two same value inductors and a corresponding switch between, to energize the two same value inductors in a balanced fashion.

12. The apparatus of claim 9, wherein the one or more additional primary inductor branches are mutually inductive to another and in series with the primary inductor.

13. The apparatus of claim 9 wherein there are two additional primary inductor branches, two additional secondary inductor branches and two additional LC circuit branches, to dynamically adapt impedance matching to a plurality of different frequency bands.

14. The apparatus of claim 13 wherein the transformer-based impedance matching network is configured as a microstrip circuit, and wherein the three different frequency bands.

15. The apparatus of claim 10 wherein the MOSFETs are N-type and biased on by a center tap voltage from the primary inductor.

16. A computer readable tangible medium including instructions that, when executed by a processor, cause the processor to adapt a transformer-based impedance matching network to match a differential source signal having an impedance ZS to a load having an impedance ZL over a plurality of operating frequencies by performing the steps of:
   determining a frequency (FT) of the differential source signal; and
   switching the matching network between one of a plurality of impedance matching configurations comprising:
   a base configuration including a main primary inductor inductively coupled to, a proximate main secondary inductor when the frequency FT is within a first operating frequency band;
   a second configuration including the base configuration and an additional primary inductor branch coupled to the main primary inductor when FT is within a second operating frequency band; and
   wherein the matching network further comprises one or more filter branches with the secondary inductor branch, each comprising an inductor coupled to an output of the main secondary conductor in series with a capacitor coupled to ground, each filter branch selected to notch filter harmonics within one of first second or third operating frequency bands.

17. The computer readable tangible medium of claim 16 wherein additional primary inductor branches each comprise two same value inductors symmetrically arranged in series, each one disposed on opposite sides of an NMOS switch.

18. The computer readable tangible medium of claim 16, wherein the second configuration further comprises an additional secondary inductor branch comprising an inductor and a parallel capacitor, the additional secondary inductor branch coupled to an output of the main secondary inductor, and ground.

19. The computer readable tangible medium of claim 16, wherein the plurality of impedance matching configurations further comprise:
   a third configuration including the second configuration, a second additional primary inductor branch coupled to the additional primary inductor branch, and a second additional secondary inductor branch including an inductor and a parallel capacitor, the second additional secondary inductor branch coupled to the additional secondary inductor branch, the second additional inductor branches switchably engaged when the frequency FT is within a third operating frequency band.

20. The computer readable tangible medium of claim 16 wherein the processor comprises a baseband processor and the matching network comprises at least part of an analog front end (AFE) module of a user equipment (UE).

21. A communication device including a transformer-based impedance matching network adapted to operate over three or more different frequency bands, the communication device comprising:
   a power amplifier circuit configured to provide a differential transmit signal over said least three different transmit frequency bands;
   one or more antennas to transmit and/or receive over the at least three different transmit frequency bands; and
   an impedance matching network coupling the power amplifier circuit to the one or more antennas, the matching network adaptable to impedance match over the three or more different frequency bands and comprising:
   a primary side inductor circuit having a main primary inductor and one or more additional primary inductor branches each including a switch to modify impedance of the matching network for a given operating frequency;
   a secondary side inductor circuit having a main secondary inductor and one or more additional secondary inductor branches each including a switch to modify impedance of the matching network for said given operating frequency; and
   a plurality of LC harmonic filter branches, one for each operating frequency.

22. The communication device of claim 21 wherein the matching network is implemented as a microstrip circuit.

23. The communication device of claim 21 wherein each switch comprises an NMOS FET and wherein each additional primary inductor branch is parallel to the main primary inductor and comprises two same value inductors symmetrically disposed on opposite side of the switch.

\* \* \* \* \*